(12) United States Patent
Macris (10) Patent No.: US 6,297,441 B1
(45) Date of Patent: Oct. 2, 2001

(54) THERMOELECTRIC DEVICE AND METHOD OF MANUFACTURE

(76) Inventor: Chris Macris, P.O. Box 2660, North Bend, WA (US) 98045

( * ) Notice: Subject to any disclaimer, the term of this patent is extended or adjusted under 35 U.S.C. 154(b) by 0 days.

(21) Appl. No.: 09/535,931

(22) Filed: Mar. 24, 2000

(51) Int. Cl.⁷ .................................................. H01L 37/00
(52) U.S. Cl. ........................ 136/201; 136/203; 136/205
(58) Field of Search ................................. 136/201, 203, 136/205

(56) References Cited

U.S. PATENT DOCUMENTS 5,824,947 * 10/2000 Macris .................................. 136/205
6,025,554 * 2/2000 Macris .................................. 136/200

* cited by examiner

*Primary Examiner*—Kathryn Gorgos
*Assistant Examiner*—Thomas H Parsons
(74) *Attorney, Agent, or Firm*—Jensen & Puntigam, P.S.

(57) ABSTRACT

A thermoelectric device containing at least one thermoelement formed by powder metallurgical techniques including, but not limited to: hot pressing, hot isostatic pressing, press and sinter and mechanical alloying.

37 Claims, 12 Drawing Sheets

THERMOELECTRIC DEVICE AND METHOD OF MANUFACTURE

BACKGROUND OF THE INVENTION

1. Field of the Invention

This invention relates to the field of thermoelectric devices and, more particularly, to a thermoelectric device wherein the device consists of thermoelements and interconnects of unique design which maximize performance while minimizing the use of costly thermoelectric material and further results in a reduction in the number of fabrication steps.

In one embodiment of the present invention, a metallic or semi-metallic support, termed a "wafer", allows powdered thermoelement material to be processed and facilitates the bonding of these formed elements to their respective interconnection members. Additionally, novel substrate and bonding techniques are also disclosed.

Other embodiments of the present invention include unique techniques relating to thermoelement surface preparation and bonding.

Lastly, other embodiments of the present invention relate to the application of thermoelectric devices in the medical therapy and electronics thermal management fields.

2. Description of the Related Art

Conventional thermoelectric devices utilize dissimilar conductive materials subjected to a temperature gradient across their leg lengths to create an EMF or electromotive force. This EMF is proportional to the intrinsic thermoelectric power of the thermoelements employed and the temperature differential between the hot and cold junctions. Alternatively, current may be introduced into the circuit to move heat, absorbing it at one junction, moving it and dissipating it at the other junction.

It is desirable that the thermoelements be of such material that the highest EMF is developed for a given temperature differential between the hot and cold junctions. The electrical resistivity and thermal conductivity of the thermoelement in the device should be as low as possible in order to reduce both electrical and thermal losses and thus increase the efficiency.

One disadvantage of current thermoelectric devices is the high cost of the semiconducting materials, which yield the highest conversion efficiencies available. A reduction in a thermoelement's cross sectional area not only reduces material volume, but increases electrical resistance proportionately. A reduction of element leg length reduces material volume and decreases electrical resistance, but it becomes increasingly difficult to maintain a temperature differential as this leg length is decreased to the point where an impracticable heat exchange mechanism is required to remove the heat faster than it is entering the thermoelectric device. This is due to the thermal conduction characteristics of the thermoelement material. Secondly, as leg lengths are further reduced, fabrication of the thermoelements themselves becomes increasingly difficult due to the semiconductor's fragile nature.

U.S. Pat. No. 3,129,117, granted to Harding on Apr. 14, 1964, discloses a method of manufacturing a thermoelectric element utilizing hot pressing in a direction perpendicular to current flow through the thermoelement.

U.S. Pat. No. 3,182,391, granted to Charland on May 11, 1995, discloses a process for forming, in one step, a thermoelement with a metallic electrical contact at one end, which comprises consolidating the thermoelectric material and metallic contact plate within a die cavity which is then hot pressed and removed from the mold cavity.

U.S. Pat. No. 3,201,504, granted to Stevens on Aug. 17, 1965, discloses a method of molding a thermoelectric couple in which dielectric sleeve members are inserted into a mold containing a conductive bottom member, powdered dissimilar thermoelectric material is added into their respective sleeves, powdered conductor is placed on top of both thermoelements, and pressing and subsequent sintering of the entire assembly yield a solid thermocouple.

U.S. Pat. No. 3,248,777, granted to Stoll in August of 1966, also discloses a thermal and electrically insulating material in which the thermoelements are cast in cavities within this insulator.

U.S. Pat. No. 3,264,714, granted to Baer, Jr. in May of 1966, discloses a thermoelectric device in which a block is composed of thermally and electrically insulating material. This block may be cut to accept inserted thermoelements or cast from a liquid or other flowable form around the spaced thermoelements and hardened. Additionally, the interconnecting members are created by electroplating over perforated metal and the top faces of each thermoelement to create the junctions.

U.S. Pat. No. 3,400,452, granted to Emley on Sep. 10, 1968, discloses using hot isostatic pressure (even, compressive pressure in all directions) to provide metallurgical bonding between the thermoelemental material and the walls of a metal tube in which it is housed.

U.S. Pat. No. 3,554,815, granted to Osborn on Jan. 12, 1971, discloses a device consisting of a thin, flexible substrate in which "bands" of dissimilar thermoelectric material are disposed on opposite sides of the substrate and perforations within the substrate contain a metallic filler to electrically connect each thermoelement.

U.S. Pat. No. 3,601,887, granted to Mitchell on Aug. 31, 1971, also discloses the use of hot isostatic pressure to provide bonding between the inner walls of a tube and the thermoelectric material.

U.S. Pat. No. 4,343,960, granted to Eguchi on Aug. 10, 1982, discloses a device consisting of a perforated dielectric substrate in which each dissimilar thermoelement is plated, in a pattern, to portions of both faces and to the walls of each thru-hole.

U.S. Pat. No. 4,459,428, granted to Chou on Jul. 10, 1984, relates to the design and manufacture of a thermoelectric device wherein the voids between each thermoelement are filled with a ceramic compound to absorb thermal expansion. Additionally, copper plates, which will later comprise the bus bars, are soldered directly to each thermoelement end and then masked and etched to form the discrete interconnects, each bridging two dissimilar thermoelements.

U.S. Pat. No. 4,470,263, granted to Lehovee, et al on Sep. 11, 1984, relates to a peltier cooled garment in which the heat pumped by the peltier unit is dissipated to the ambient via cooling fins.

U.S. Pat. No. 4,905,475, granted to Tuomi on Mar. 6, 1990, relates to a thermoelectric based personal comfort air conditioning unit. Ambient air enters and is split to pass over both the hot and cold faces of the thermoelectric device. Depending on the desired air temperature by the user, a movable baffle will distribute the correct amounts of hot and cold air to the individual.

U.S. Pat. No. 4,930,317, granted to Klein on Jun. 5, 1990, relates to a thermoelectric based localized hot and cold therapy apparatus which includes a heat sink and possibly a fan to dissipate rejected heat.

U.S. Pat. No. 5,067,040, granted to Fallik on Nov. 19, 1991, relates to the use of thermoelectric cooling to cool computer boards within an enclosure. The thermoelectric cooling device is mounted in an opening through a partition for transferring heat out of the sealed enclosure.

U.S. Pat. No. 5,097,828, granted to Deutsch on Mar. 24, 1992, relates to a thermoelectric based therapy device comprising a heat sink and fan for dissipating heat moved and generated by the peltier devices.

U.S. Pat. No. 5,103,286, granted to Ohta on Apr. 7, 1992, discloses a simultaneous sintering and bonding of the thermoelements to themselves and to their respective interconnection members in the absence of pressure. Sintering, which is the heating of an aggregate of metal particles in order to create agglomeration, does not involve simultaneous pressure.

U.S. Pat. No. 5,108,515, granted to Ohta on Apr. 28, 1992, discloses a Bi, Te, Se, Sb thermoelemental material which is pulverized to a specific particle size and then forming a green molding which is then sintered.

U.S. Pat. No. 5,108,788 and U.S. Pat. No. 5,108,789, both granted to Rauch, Sr. on Jan. 5, 1988 disclose a PbTe thermoelemental material in which the compound is: melted, chill cast into an ingot, ground to a particle size of less than 60 mesh, cold pressed to 30–70 kpsi, and finally sintered.

U.S. patent No. 5,246,504, also granted to Ohta on Sep. 21, 1993, is nearly identical to what is claimed to U.S. Pat. No. 5,108,515.

U.S. Pat. No. 5,318,743, granted to Tokiai on Jun. 7, 1994, discloses to "presinter" a Bi, Te, Se, Sb thermoelemental material, then mold the presintered powder and sinter the resultant form also using hot isostatic pressing technology. The actual thermoelements are then cut from the sintered bulk.

U.S. Pat. No. 5,429,680, granted to Fuschetti in Jul. of 1995, relates to a nickel diffusion barrier layer coated directly onto each thermoelement end.

U.S. Pat. No. 5,434,744, granted to Fritz on Jul. 18, 1995, discloses a substrated thermoelectric device in which thermoelemental spacing is less than 0.010 inch and thermoelemental thickness is less than 0.050 inch. In addition, an improved device is claimed to have greater than 300 thermoelements and their said thickness is "approximately" 0.020 inch.

U.S. Pat. No. 5,623,828, granted to Harrington on Apr. 29, 1997, relates to a thermoelectric air cooling device for the passenger of a vehicle. A fan, blowing ambient air across both the hot and cold faces of the thermoelectric device, includes a design permitting the cold air to blow onto the passenger while the hot air is exhausted away.

U.S. Pat. No. 5,800,490, granted to Patz, et al on Sep. 1, 1998, relates to a portable cooling or heating device incorporating a thermoelectric assembly comprising: a peltier device, gel pack to interface with the user along with a fan and radiator to dissipate or absorb thermal energy from the surrounding air.

U.S. Pat. No. 5,817,188, granted to Yahatz, et al on Oct. 6, 1998, relates to a thermoelectric module comprising thermoelements whose junctions are coated with bismuth or a bismuth alloy. Additionally, a solder comprising bismuth and antimony is utilized to joint the coated thermoelements to conductive interconnecting bus bars.

U.S. Pat. No. 5,890,371, granted to Rajasubramanian, et al on Apr. 6, 1999, relates to a passive and active air conditioning system for an enclosure housing heat producing equipment. This closed hybrid system cools the air existing within the heat producing equipment enclosure housing by recirculating this air across both a heat pipe device and also a thermoelectric device which transfers the heat to the ambient air.

U.S. Pat. No. 5,981,863, granted to Yamashita, et al on Nov. 9, 1999, relates to manufacturing a thermoelement in which molten thermoelement material is rapidly cooled, powdered and hot pressed within a range of time, temperature and pressure in order to reduce grain size, and thus increase material efficiency.

U.S. Pat. No. 5,987,890, granted to Chiu, et al on Nov. 23, 1999, relates to cooling an electronic component within a portable computer using a heat pipe or peltier device to move heat from the electronic component to a thermal reservoir, such as a battery.

U.S. Pat. No. 6,023,932, granted to Johnstone on Aug. 25, 1999, relates to a portable topical heat transfer device comprising a thermoelectric unit and heat sink with a fan mounted to the warm side of the peltier device.

U.S. Pat. No. 6,025,544, granted to Macris on Feb. 15, 2000, relates to a block of metallic material into which cavities are formed and filled with thermoelement material. This material is compacted and sintered. The resultant block structure is sliced, electroplated, etched and mounted to form a thermoelectric device.

A disadvantage of the existing art is the bond strength between the typically brittle thermoelements and their interconnects. In addition, the diffusion of metallic species when these dissimilar materials are in contact must be mitigated. Lastly, the bonding structure, between thermoelement and its respective interconnect, must not itself possess a significant Seebeck Coefficient so as not to reduce the performance of the two P and N-type thermoelements.

A disadvantage to the existing cold therapy technologies incorporating thermoelectric devices as heat pumps is the means by which the pumped heat is dissipated from the hot face of the thermoelectric device. Fans and/or heat sinks are cumbersome and reduce flexibility of the therapy unit.

A current disadvantage of the current personal computer or electronics enclosure cooling art is the complexity and inefficiency of the systems resulting in high costs.

SUMMARY OF THE INVENTION

Accordingly, it is the overall object of the present invention to provide an efficient thermoelectric device, which minimizes the device fabrication costs through the simplification of the fabrication process and reduction of materials.

An additional object of the present invention is to provide a thermoelectric device fabrication method in which a metallic or semi-metallic support (termed a wafer) contains several thru-holes. Dissimilar thermoelectric material is disposed and thermally processed in these thru-holes to yield solid thermoelements.

Again, another object of the present invention is to provide a thermoelectric device fabrication method in which the walls of wafer thru-holes are coated with either elements or compounds to prevent formation of intermetallic compounds between the thermoelements and the walls during the fabrication of a thermoelectric device.

Yet again, an object of the present invention is to provide a thermoelectric device fabrication method in which a reusable magnetic mask is utilized to economically and effectively mask regions of the wafer during chemical processing.

Still another object of the present invention is to provide an economical thermoelectric device fabrication method which improves the bonding between thermoelement and interconnect through anodic cleaning/etching and cathodic surface activation in both acid and alkaline solutions.

Another embodiment of the present invention is to provide a thermoelectric device design wherein the completed device utilizes novel substrates and bonding methods which facilitate economical fabrication, yet offer high thermal performance and structural integrity.

It is another object of the present invention to demonstrate a formula relating the optimal range of thermoelement leg lengths given the material's thermal conductivity value. This results in a drastic reduction in the volume of expensive thermoelement material required.

Still another object of the present invention is to provide an improved thermoelectric-based heating and cooling therapy device wherein the heat pumped from the source (user) is stored for reuse rather than dissipated to ambient surroundings and eliminates cumbersome heat exchangers.

Another object of the present invention is also to provide an improvement to existing electronics enclosure air conditioning by utilizing thermoelectric-based conditioning of an input ambient airstream flowing through the enclosure. This allows a thermoelectric device to operate efficiently while reducing the internal enclosure temperature.

Lastly, the final overall object of the present invention is to combine all these unique design aspects and individual fabrication techniques into an overall method of thermoelectric device manufacture, which will yield a device of superior construction and value.

BEST MODE FOR CARRYING OUT THE INVENTION

To effectively absorb and dissipate heat, in addition to providing high electrical conductivity to a thermoelectric device, the interconnects should be of a highly electrical and thermally conductive material such as copper, aluminum, or their respective alloys. Optimally speaking, the thermoelement material, composed of a bismuth-tellurium, bismuth-selenium, antimony-tellurium alloy composition, is appropriately doped to yield both positive and negative conductivity type thermoelements.

FIGS. 1a through 1m illustrate a process flow for the fabrication of the present invention.

Figure 1A:
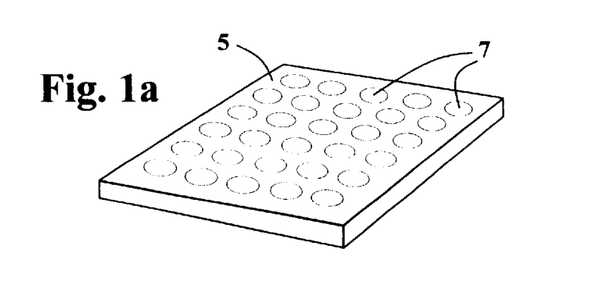
FIG. 1a through 1m illustrate a method for the fabrication of the present invention.

As shown in FIG. 1a, the structure, termed a "wafer" 5, is composed of a metallic or semi-metallic material, possibly non-ferrous based. It contains multiple thru-holes 7 formed by either chemical milling (etching), punching or stamping which will contain two dissimilar types of thermoelement material. The approximate thickness (in the finished product) of this wafer will correspond to the final thermoelement leg length. Due to the processes involved, the wafer thickness is realistically limited to 0.125 centimeters or less.

Prior to the dispensation of the thermoelement materials, the wafer's thru-hole walls may be coated with an oxide of the base wafer composition or other metallics and compounds including: iron oxide, nickel, cobalt, tungsten, molybdenum and carbon. Optimally, the coating is electrically conductive or semi-conductive.

Depending upon the thermoelement processing temperatures, i.e. time, temperature and pressure, coupled with the wafer and thermoelement compositions, an intermetallic layer may form at the thermoelement thru-hole wall interface. The intermetallic, if left on the thermoelement, will degrade the performance of the completed thermoelectric device, therefore, its formation must be prevented, if formed, must be removed.

Figure 1B:
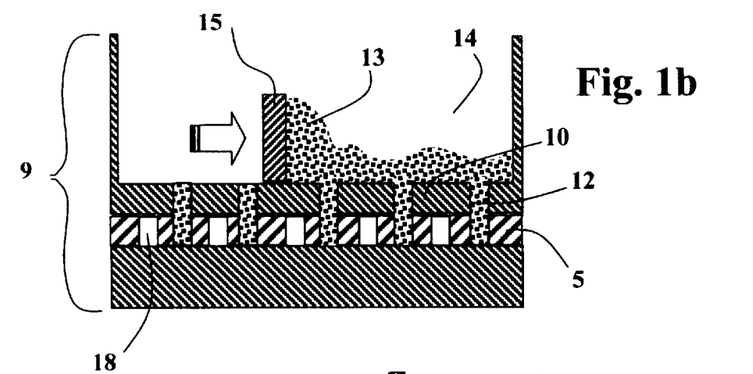
Figure 1C:
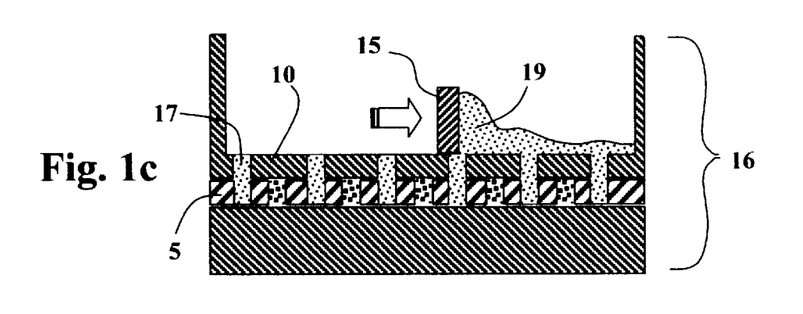

Reference is now made to FIGS. 1b and 1c wherein two similar mechanisms 9, 16 are utilized to simultaneously dispense thermoelement material into multiple thru-holes 7 within the wafer 5. Each mechanism corresponds to a dissimilar type of thermoelement material which is placed in alternate rows of thru-holes.

Thermoelement material may consist of an alloyed and grown ingot which has been pulverized to yield powdered or granular stock, or consist of a mixture of the powdered or granular metallic elements which are unalloyed prior to dispensation. Additionally, tablets or pellets may be formed with either composition which can also be dispensed into the wafer's thru-holes.

In one additional embodiment relating to the preparation of thermoelement material, a mixture of methanol and boric acid is applied to the thermoelement powders thereby coating the surface of each particle. During the sintering process, any surface oxides present on the particles are "gettered" by the boric acid, resulting in the formation of borates. This mechanism "cleans" the surface of each particle and thus, facilitates the bonding of each particle to the other.

An empty wafer 5, shown in FIG. 1a, is loaded into the dispensation mechanism 9 of FIG. 1b, mounted below a stencil-like cover plate 10 with apertures 12 corresponding to the thru-holes for one type of thermoelement material 13. The thermoelement arrangement of the present invention consists of alternating P and N-type thermoelements. The thermoelement material 13 is then poured into the stencil reservoir 14 where it is bladed across the stencil surface by a doctor blade or squeegie-like instrument 15. The wafer thickness plus the stencil thickness allow for the correct volume of powder to be dispensed into the thru-holes of the wafer.

When the entire surface of the wafer has been filled and bladed, the filled holes are then compacted simultaneously with either a matrices of metallic press pins or a flat elastomeric pad, both of which compact the powder thru the stencil apertures and down to the wafer surface.

Once compacted, the wafer is removed and transferred to the second dispensation mechanism 16 in FIG. 1c, which deposits and compacts the other dissimilar type thermoelement material 19. This mechanism operates identically to the previous unit in FIG. 1b, however, its stencil apertures 17 correspond to the unfilled thru-holed holes 8 which remain with in the wafer.

Figure 1D:
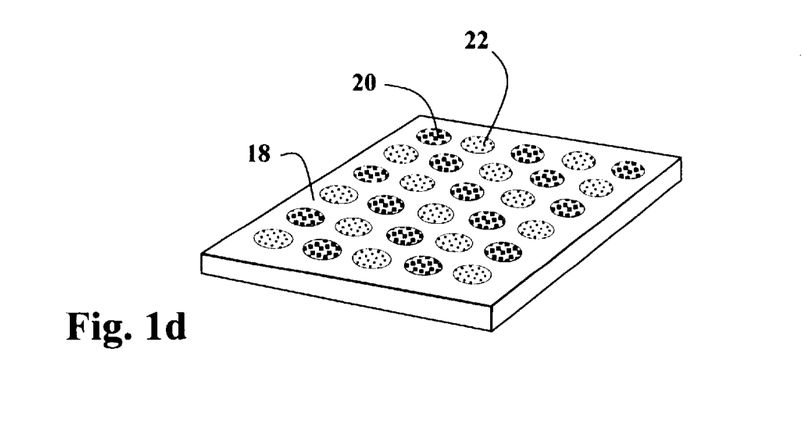

The resultant wafer 18, filled with dissimilar type thermoelements 20, 22, can be seen in FIG. 1d.

The wafers must now be processed thermally with powder metallurgical techniques in order to create interparticulate bonding, resulting in solid, dense thermoelements. These techniques allow both P and N-type thermoelement material to be simultaneously processed. The thermally based powder metallurgical techniques include: hot pressing, hot isostatic pressing, press and sintering, and mechanical alloying. The first two processes involve the simultaneous application of heat and pressure. Press and sinter technology typically applies heat and pressure in separate steps. Lastly, mechanical alloying can incorporate heat and pressure simultaneously or as separate, discrete steps.

Figure 1E:
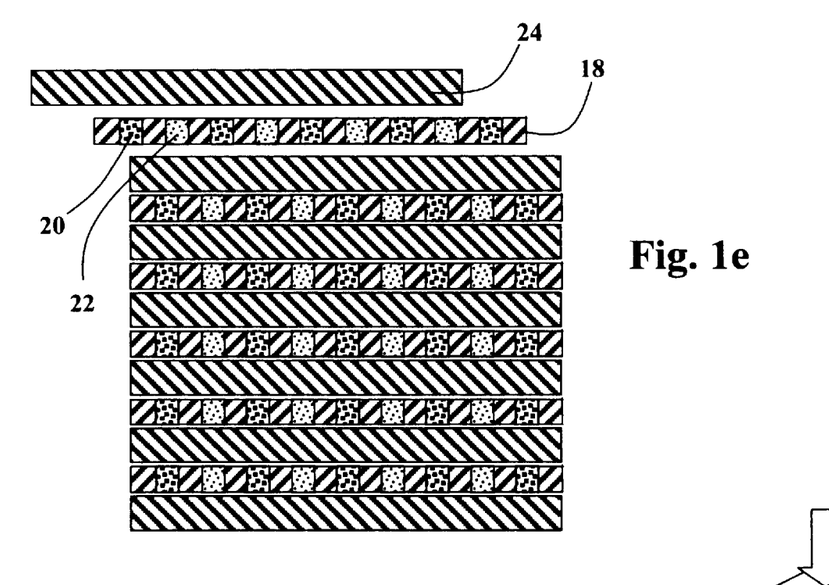
Figure 1F:
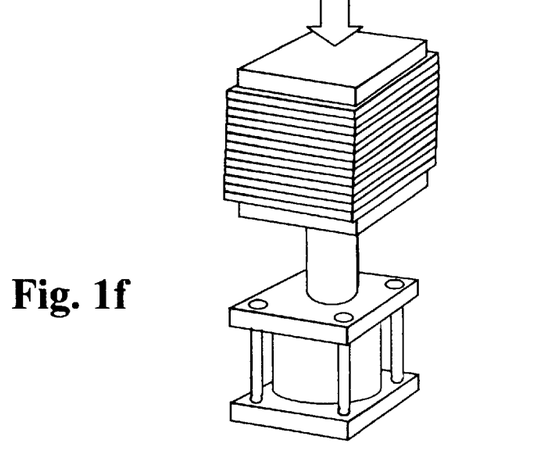

FIG. 1e discloses a method of hot pressing multiple wafers utilizing sheets of heat resistant material 24. Compressive force is applied to each thermoelement via their exposed surfaces. A material, such as aluminum or other metallic sheet or foil, is stacked alternately with the filled wafers, such that, all exposed thermoelements 20, 22 wafer are covered by the sheet material 24. Pressure and heat are applied to the stack by means of a heated press seen in FIG. 1f. The heat resistant material will deform under this heat and pressure and transfer compressive force to each thermoelement from both faces of the wafer.

In one embodiment of the present invention, a heat resistant material envelops each wafer face and then is subjected to hot isostatic pressure. This process utilizes a liquid or gas under extreme pressure to apply compressive force to the wafer from all directions. The force is again transferred through the heat resistant material to each face of thermoelements resulting in a high degree of density.

In another embodiment of the present invention, the press and sinter technique is utilized to densify the thermoelements. This technique, essentially a "pressureless" sinter process, eliminates the requirement of a covering material in order to transfer pressure to each thermoelement face.

Figure 1G:
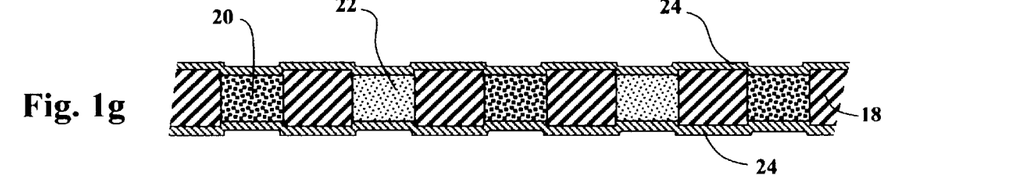

FIG. 1g depicts the wafer 18 and heat resistant covering material 24 following either the hot pressing or hot isostatic operation. The heat and pressure has densified each thermoelement 20, 22 thereby reducing their respective thicknesses.

Figure 1H:
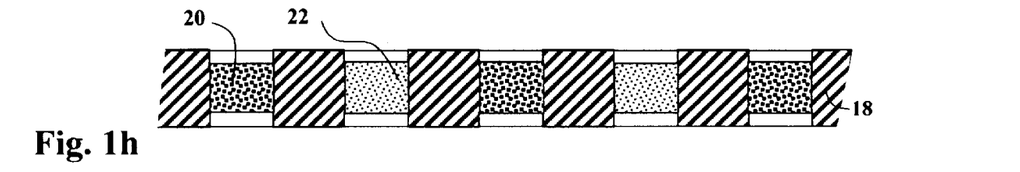

FIG. 1h depicts the wafer 18 after the removal of the envelope or covering material 24. Prior to the bonding of interconnection members, the entire wafer surface and thermoelement faces must be cleaned and activated to accept a metallization layer to facilitate bonding and mitigate diffusion between interconnect and thermoelement.

Each type of thermoelement material behaves differently to a particular surface etchant/cleaner and activator requiring a unique chemistry and process for each material. Both types, however, are best etched/cleaned and activated electrochemically, in that an electric potential is applied to the parts while in a conductive, corrosive solution.

In one embodiment, the wafer is immersed into an alkaline solution, preferably sodium or potassium hydroxide-based. A positive electric potential (voltage) is applied to the wafer (the anode) containing thermoelements and a negative potential is applied to a metallic member or electrode (cathode) which is also immersed in the solution. The wafer with its thermoelement surfaces are exposed to the electric current via the solution, causing a surface etching of the elements. The wafer is then rinsed and chemically neutralized to remove the surface residue and expose clean thermoelement surfaces.

In another embodiment, the wafer is immersed into a solution containing chromic acid. The wafer is immersed and electrified as in the previous embodiment.

Following the surface etching and cleaning of the thermoelements, a metallic layer must next be deposited. The bismuth-tellurium alloy thermoelement materials, however, easily forms surface oxides, creating a passive condition. Therefore, it is necessary to activate these surfaces in order to achieve an adherent metal layer.

Cathodic activation, wherein the wafer (containing thermoelements) is connected to a negative electric potential (cathode), has been found empirically to effectively activate the tenacious thermoelement surfaces. The wafer is immersed into an acidic solution, preferably containing sulfuric acid, and connected to the negative potential terminal of a power supply. A metallic electrode, also immersed, completes the electrical circuit through its connection with the positive terminal of the power supply. Optimally, the wafer is subjected to an electric current density greater than 150 amps per square foot of total negatively charged surface area exposed in the solution.

Figure 1I:
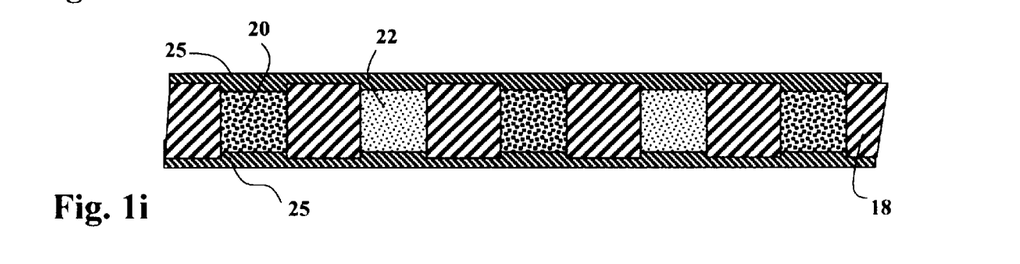

Immediately following the cathodic activation step, the entire wafer is subjected to either electroless or electroplating, as seen in FIG. 1l, which deposits a continuous metallic layer 25 over the entire wafer surface (including the thermoelement surfaces). The electroplating and cathodic activation electric potential is to be applied prior to immersion so as to not passivate, or oxidize the thermoelement surfaces.

Figure 1J:
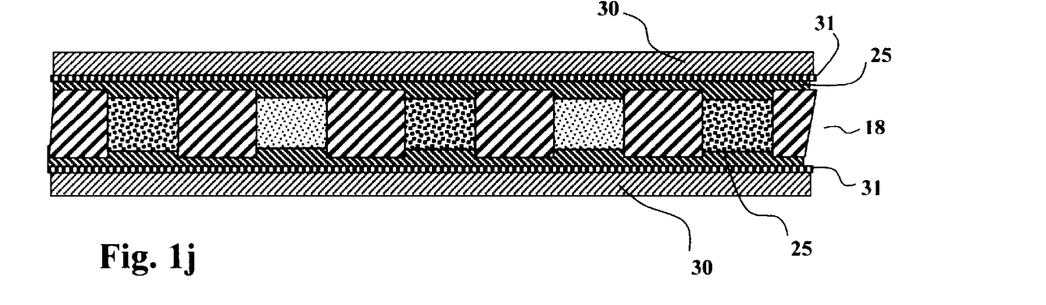

FIG. 1j introduces a metallic sheet 30 which is soldered 31 to each face of the wafer 18 via the metallized layer 25. The metallic sheets 30, preferably comprised of highly thermal and electrically conductive material, will ultimately comprise the interconnection members.

In one embodiment, a molten or semi-molten metallic spraying process, such as plasma or flame spraying is utilized to build a metallic deposit in lieu of the metal layers 25, 30, 31 plated and/or soldered in FIGS. 1l and 1j.

Figure 1K:
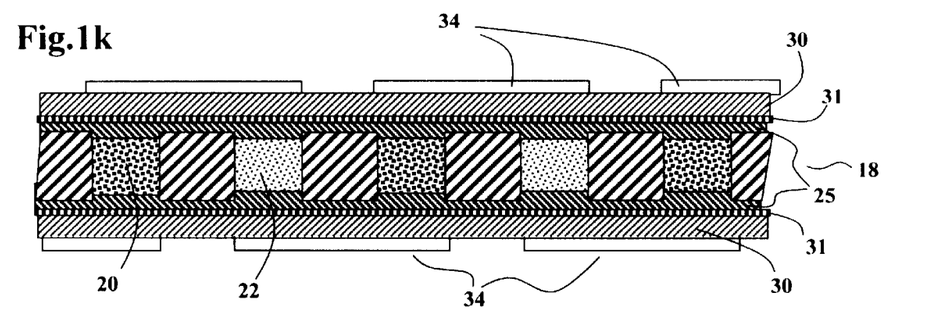

Within FIG. 1k, it can be seen that an etch resistant mask 34 has been applied over select regions of the metallic sheet 30 in order to protect the eventual interconnection members from chemical attack. Typically, a screen or stencil pre-inked mask, or "resist", is employed, which may later be stripped chemically.

Figure 2:
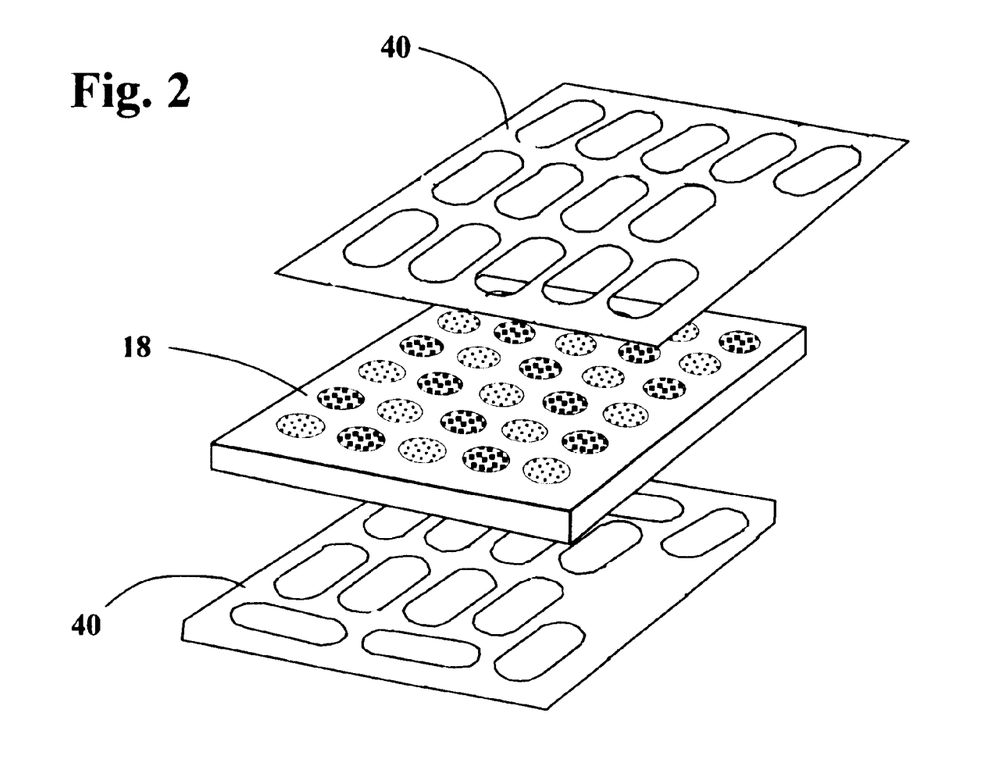
FIG. 2 is a pictorial representation illustrating the use of a solid, reusable magnetic mask in the fabrication of the present invention.

In one embodiment of the presents invention, a reusable, solid magnetic mask 40 (FIG. 2) is utilized on both faces of the wafer 18 in lieu of printed resists. The masks are die or laser cut from flexible magnetic material composed of ferrites in a polymer binder. These masks can be utilized in both plating and chemical etching operations.

Figure 1L:
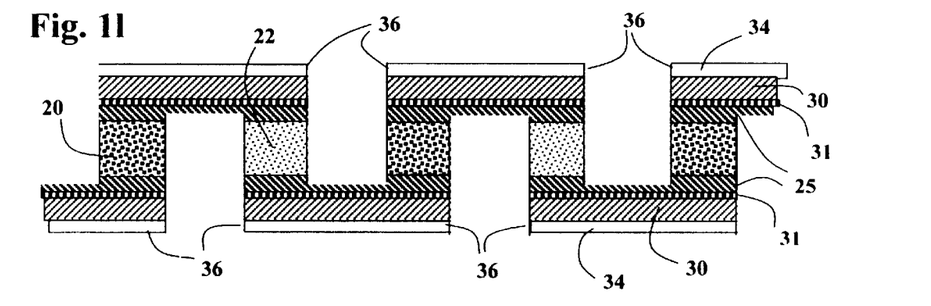

As seen back in FIG. 1l, the unmasked regions of the metallic sheet 36 have been subjected to a selective chemical etchant to remove regions of the metal layers and wafer in order to create completed thermocouples 45.

Figure 1M:
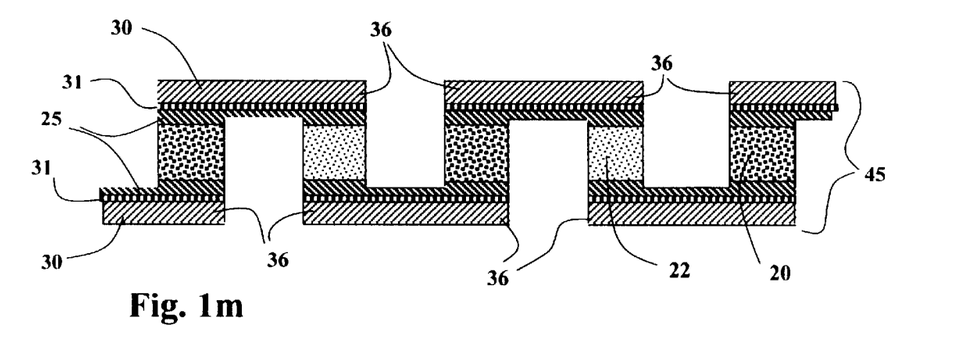

Lastly, FIG. 1m contains the series thermocouples 45, minus the etch mask 34, ready to be mounted to a structurally supporting substrate. Bonding may be accomplished through the use of a thermally and/or electrically conductive adhesive, such as an epoxy. Additionally, mechanical clamping between two substrates may also be employed.

In one embodiment, a perforated metallic substrate is utilized in order to reduce weight and also to facilitate handling of the fragile thermocouples following the etching step.

The metallic substrates, whether perforated or solid, may be subjected to an anodizing or conversion coating process to create a dielectric surface layer in order to prevent any electrical "shorting" between the mounted thermocouples.

Figure 3A:
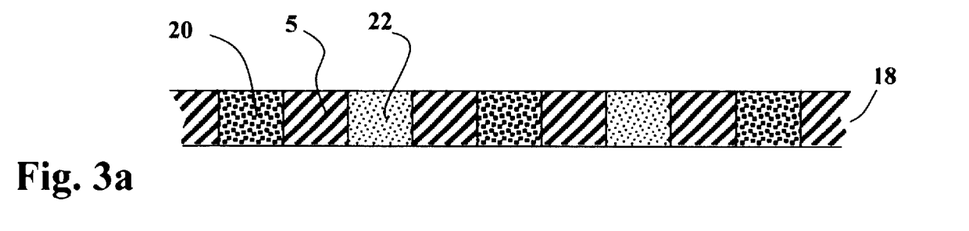
FIGS. 3a through 3c illustrate a method for the metallization of the thermoelements contained within the present invention.
Figure 3B:
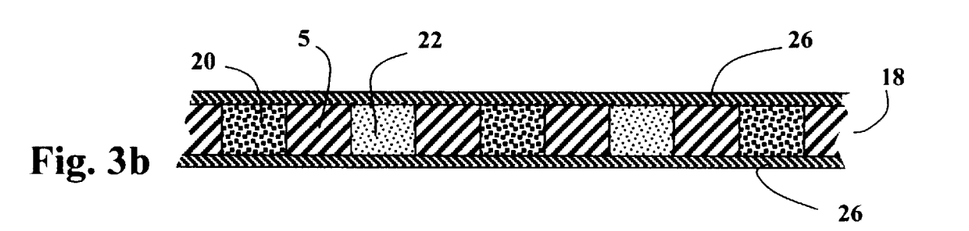
Figure 3C:
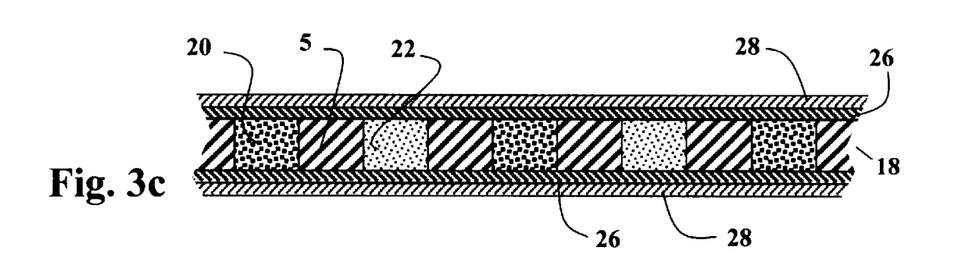

FIGS. 3a through 3c illustrate an alternate embodiment wherein a bismuth layer 26 is either electrolessly (immersion) or electroplated on each thermoelement surface.

FIG. 3a depicts a filled wafer 18 prior to metallization.

In FIG. 3b, the bismuth layer 24 deposited onto the wafer 18 is then reflowed, or melted and solidified in order to increase the bond strength to the thermoelements. This reflow technique creates an alloyed bond which penetrates each P and N-type thermoelement, junction face resulting in higher bond strength over standard metallization techniques.

Reference is now made to FIG. 3c, wherein the cathodic activation and electroless/electroplating techniques, from the previous embodiments, are employed to deposit an additional adherent metal layer 28 over the reflowed bismuth layer 26. This metal layer 28 permits the attachment of the interconnection member layers via soldering while mitigating any diffusion between dissimilar materials.

Figure 4:
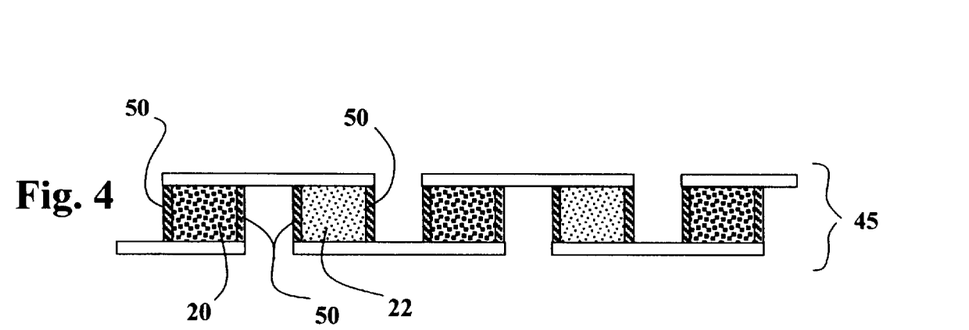
FIG. 4 is a sectional view depicting intermetallic layers deposited on each thermoelement in the present invention.

Next, as seen in FIG. 4, the completed series thermocouples 45 may contain an intermetallic layer 50 bonded along the leg lengths of each thermoelement 20, 22. If left, this layer will degrade the performance of the thermocouples by creating a partial electrical short between the hot and cold junctions.

In one embodiment electrochemical removal is employed by immersing the thermocouple assembly into an alkaline or acidic (corrosive) solution and applying either a positive or negative potential (voltage) to this assembly. An immersed electrode completes the electrical circuit by accepting the voltage polarity opposite that of the thermocouple assembly. After removal from the solution, the assembly is chemically treated and rinsed to eliminate any residues. One effective solution for the intermetallic removal contains chromic acid.

Figure 5:
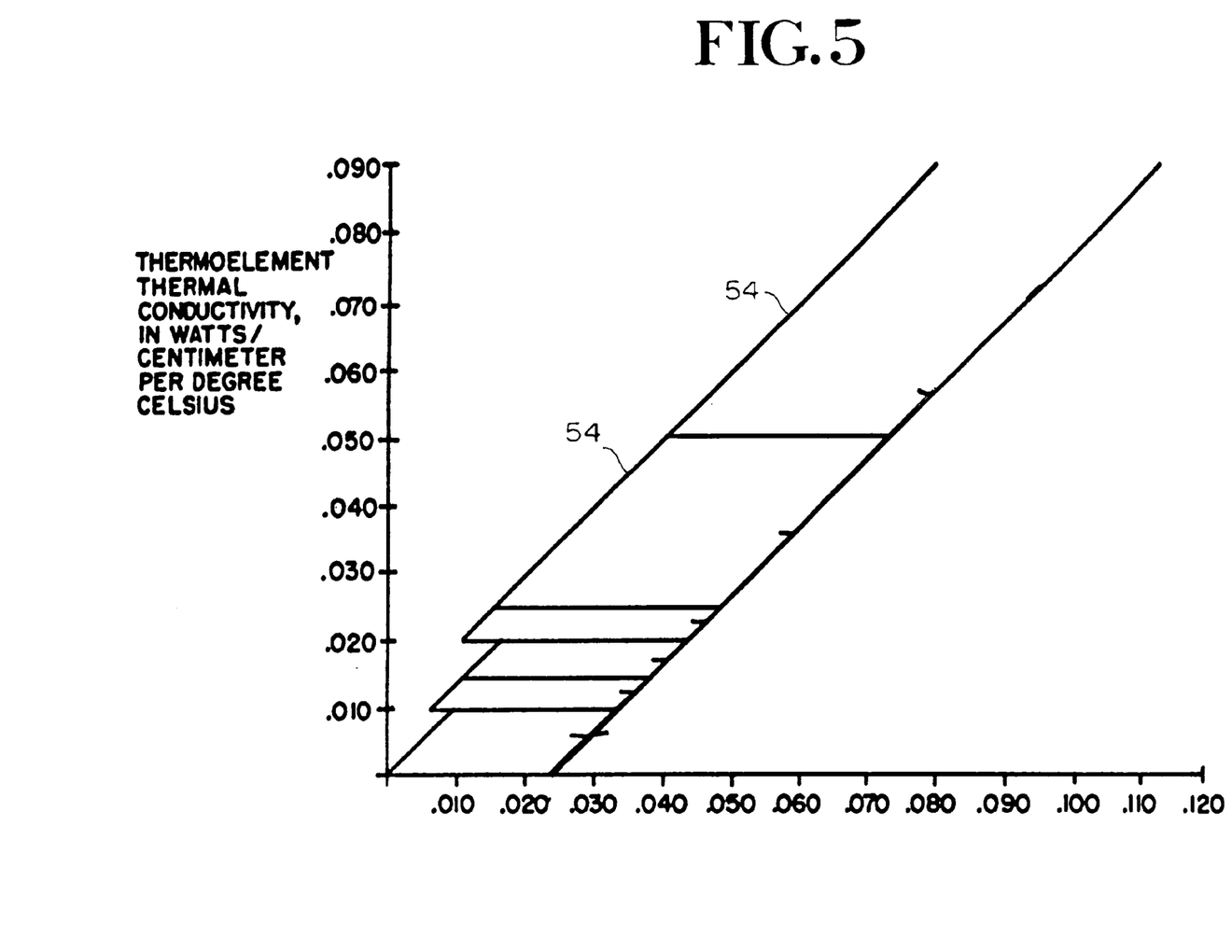
FIG. 5 is a graph of the prior art depicting a series of optimal leg length ranges based on a relationship between a thermoelement's Thermal Conductivity value.

With respect to FIG. 5, reference is made to U.S. Pat. No. 6,025,554, granted to Macris Feb. 15, 2000, wherein the prior art depicts the derived relationship between any thermoelement's leg length and its particular thermal conductivity value. When this value is given in watts/centimeter per degress Celsius, for any thermoelectric material, the optimum thermoelement leg length 54 is equal to that particular thermal conductivity value with a leg length tolerance.

Figure 6:
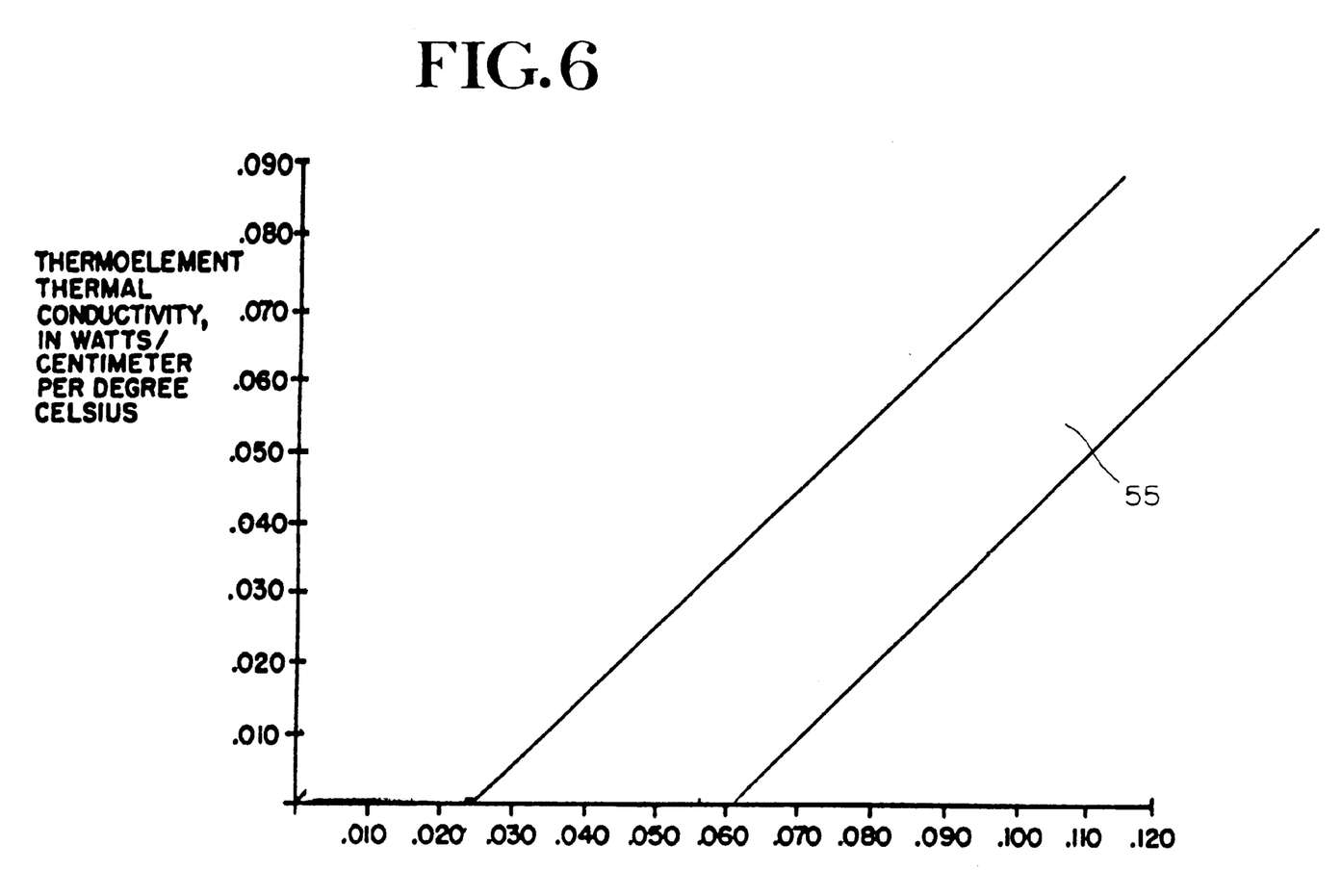
FIG. 6 is a graph illustrating the empirically derived formula between a powder metal fabricated thermoelement material Thermal Conductivity value and its optimum thermoelement leg length range.

As seen in FIG. 6, an optimized range of thermoelement leg lengths 55 is disclosed, given the thermoelement material's thermal conductivity value (K), in watts/centimeter per degree Celsius. Through the use of thermoelements formed by powder metallurgical techniques, such as: hot pressing and sintering, hot isostatic pressing and mechanical alloying, an empirically derived formula was developed. Each thermoelement has a leg length range 55, in centimeters equal to:

(K+0.026 centimeters) to (K+0.061 centimeters).

Figure 7:
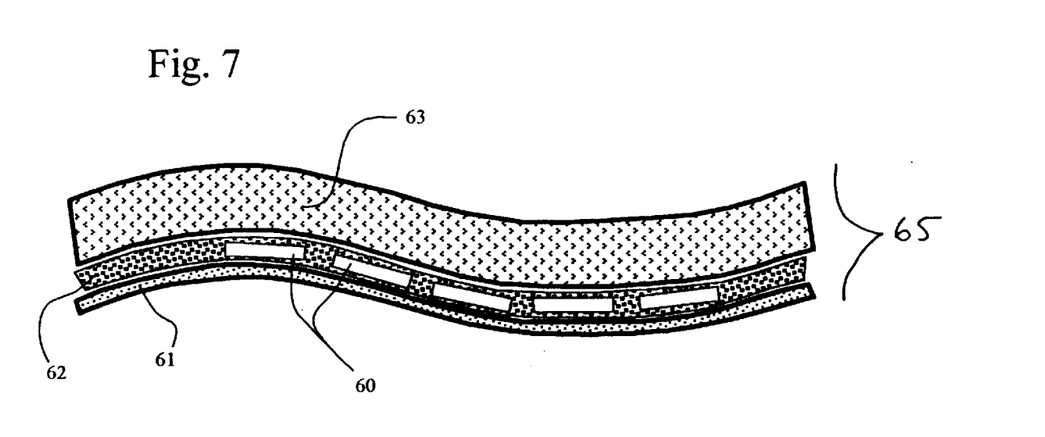
FIGS. 7 and 8 illustrate one application of the present invention wherein the apparatus is utilized for heating and cooling therapy.

Reference is now made to FIG. 7 wherein an application of thermoelectric devices is depicted. A wearable heating and cooling therapy device 65, consisting of: thermoelectric devices 60, each with one face contacting a thermally conductive compliant layer 61 interfacing the wearer, a flexible thermally insulating layer 62 and a flexible thermal storage medium 63. With a face which contacts those of the thermoelectric devices.

Figure 8:
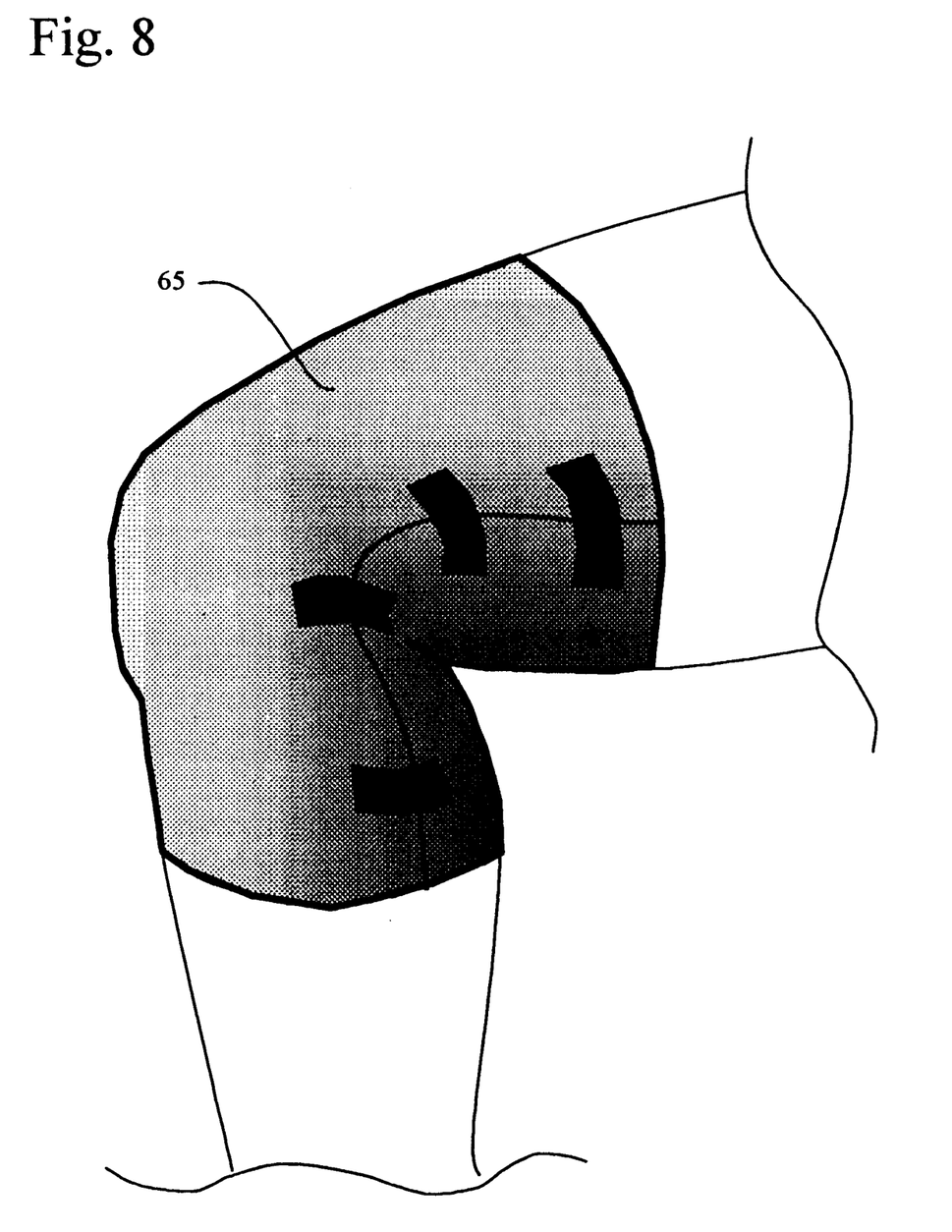

When it is desirable to cool selected portions of the wearer's body (FIG. 8), the thermoelectric devices will "pump" heat away from the user via the compliant layer 61 to the thermal storage medium 63. The insulating layer 62 maintains the temperature differential, established by the thermoelectrics 60, between the wearer and the storage medium 63. A reversal in the polarity will cause the stored thermal energy in the storage medium 63 to be transferred to the user when heat therapy is desired.

In one embodiment, the thermal storage medium 63 may be comprised of a phase-change material which will accommodate additional thermal energy (per pound of medium) without significantly raising the temperature of the thermal storage medium. This is accomplished through the transformation from one "phase", or form, to another when thermal energy is absorbed. For example, a liquid phase change material (liquid at room temperature), may absorb an order of magnitude or more thermal energy (before its full phase transformation to a gas phase) than an equivalent weight quantity of non-phase change material without increasing its actual temperature.

Other embodiments include the use of polymer-based, elastomer-based or ceramic-based materials in the construction of the thermal storage medium 63.

Next, as seen in FIGS. 9 through 12, various embodiments are disclosed for an additional application of thermoelectric devices whereby the incoming airstream, through an electronics containing enclosure, is conditioned, or cooled.

Figure 9:
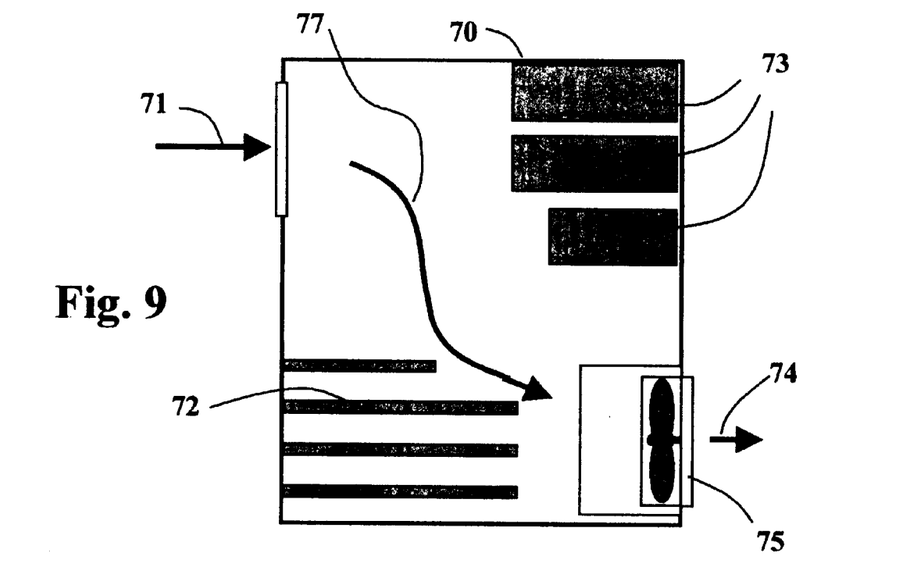
FIGS. 9 through 12 illustrate various embodiments for conditioning an airstream through an enclosure containing electronic components.

FIG. 9 displays the current construction and action of the prior art. An enclosure 70, which may house various heat generating electronic components and assemblies 72, 73, typically draws ambient air 71 throughout the enclosure to aid in the dissipation of heat generated by the electronics 72, 73. A fan assembly 75, usually located within the enclosure 70, draws this ambient air 71 past the electronics and exhausts the heated airstream 74 back to ambient.

Figure 10:
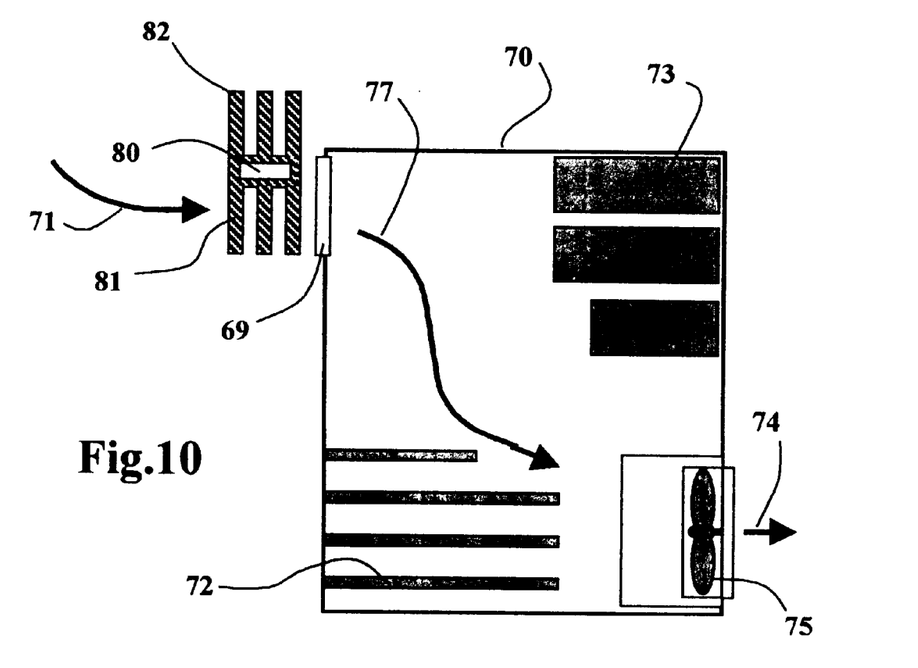

Within FIG. 10, an assembly comprising a thermoelectric device 80, a hot face heat sink 82 and cold face heat sink 81 is mounted in front of the ambient air inlet 69 to the enclosure 70. Ambient air 71 is actively drawn through the cold face heat sink 81 by the fan assembly 75. The thermoelectric device 80 cools this incoming ambient airstream 71, thereby dropping the air temperature upon entry into the enclosure. The cooled airstream 77 increases the thermal transfer efficiency between the electronics 72, 73 and the airstream 77. The heated air 74 is exhausted back to ambient. The hot face heat sink 82 dissipates its pumped thermal energy passively to ambient.

Figure 11:
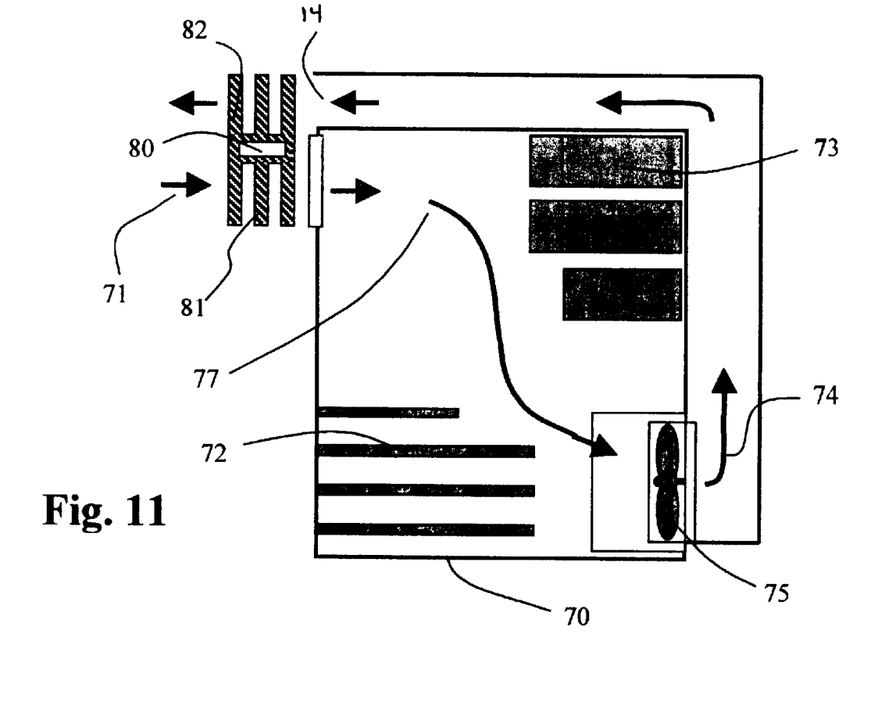

FIG. 11 illustrates an embodiment of the present invention whereby the heated airstream 74, exhausted by the fan assembly 75, is ducted and blown across the hot side heat sink 82, mounted to one face of the thermoelectric device 80, increasing the heat dissipation of this 82 to ambient.

Figure 12:
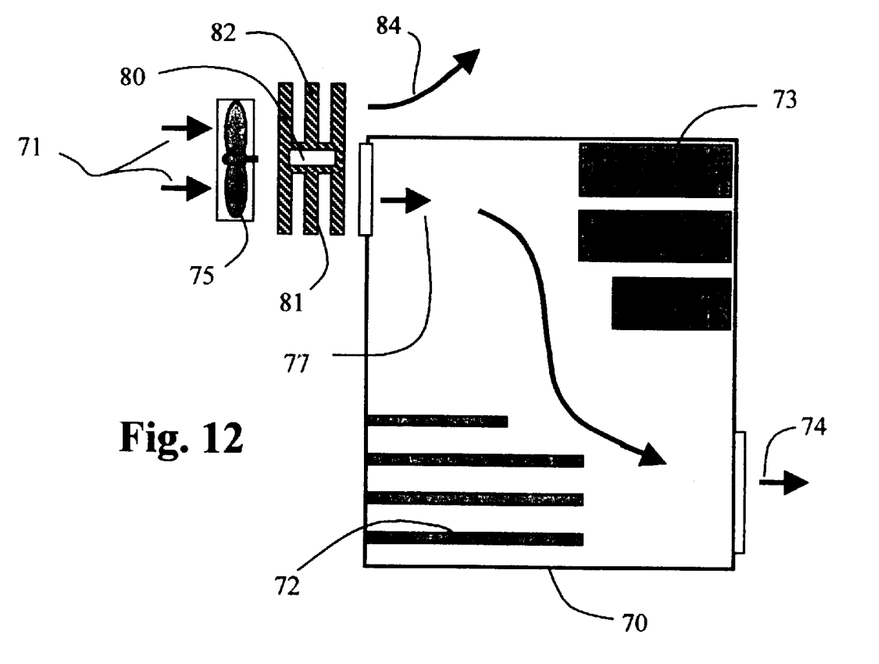

FIG. 12 depicts an additional embodiment wherein a fan assembly 75 is mounted "upstream" from the thermoelectric device 80 and heat sinks 81, 82. The ambient airstream 71 is pushed through the heat sinks 81, 82 and the enclosure 70 where the heated airstream 74 is exhausted.

What is claimed is:

1. A thermoelectric device containing at least one thermoelement formed by powder metallurgical techniques wherein each thermoelement has a leg length range, in centimeters, equal to: K+0.026 centimeters to K+0.061 centimeters, wherein K is the thermoelement material's thermal conductivity value, given in watts/centimeter per degree Celsius.

2. A thermoelectric device design, providing at least one wafer containing at least two through-hole cavities to accept thermoelements, wherein the wafer thickness is equal to or less than 0.125 centimeters.

3. A thermoelectric device design, as in claim 2, wherein the wafer is composed of a metallic material.

4. A thermoelectric device design, as in claim 2, wherein the wafer is composed of a non-ferrous metallic material.

5. A thermoelectric device design, as in claim 2, wherein the walls of the wafer through-holes are coated with an electrically conductive material.

6. A thermoelectric device design, as in claim 2, wherein the walls of the wafer cavities are oxidized to mitigate the formation of an intermetallic layer on the thermoelements.

7. A method of manufacturing a thermoelectric device, including at least one thermoelement, one heat rejecting interconnection member, one heat absorbing interconnection member, one wafer containing at least two through holes, each containing dissimilar thermoelectric material comprising the steps of:
   a. Simultaneously dispensing one type of thermoelectric element material to at least two wafer through holes;
   b. Simultaneously cold compacting more than one thermoelement with the wafer;
   c. Covering each wafer face with a heat resistant material;
   d. Applying hot isostatic pressure to the entire covered wafer;
   e. Removing the covering;
   f. Cleaning and electrochemically activating the entire wafer surface including the exposed faces of each thermoelement;
   g. Plating the entire wafer surface including all exposed faces of each thermoelement;
   h. Bonding a metallic sheet to each face of the wafer via the plated layer;
   i. Chemically removing part of each metallic sheet and all of the wafer material;
   j. Mounting the completed device to a substrate.

8. A method of manufacture, as in claim 7, wherein the wafer is a metallic material.

9. A method of manufacture, as in claim 7, wherein the thermoelement material is in powder form.

10. A method of manufacture as in claim 7, wherein the thermoelement material is in tablet form.

11. A method of manufacture, as in claim 7, wherein step (a) involves the use of a squeegie for the dispensation of the thermoelement powders.

12. A method of manufacture, as in claim 7, wherein the step (c) covering is a metallic foil.

13. A method of manufacturing, as in claim 7, wherein the thermoelement material in step (a) is a mixture of metallic elements which, following step (d) will become the resultant P and N-type thermoelement compounds.

14. A method of manufacture, as in claim 7, wherein step (d) involves the use of pressureless sintering heat only.

15. A method of manufacture, as in claim 7, wherein step (g) utilizes a metallic spraying process in lieu of the electroplating and/or metallic sheet in steps (g) and (h) respectively.

16. A method of manufacture, as in claim 7, which utilizes a conversion coated, anodized substrate.

17. A method of manufacture as in claim 7, wherein step (i) involves the use of a reusable magnetic mask material comprising a pre-patterned mask which is placed on each face of the wafer to facilitate partial chemical removal of the metallic sheet.

18. A method of manufacture, as in claim 7, wherein the surface preparation step (f) of each thermoelement for interconnection bonding comprises:
   a. Immersion of the thermoelements into an alkaline solution;
   b. Making the thermoelements anodic through the application of an external positive polarity voltage to the thermoelements;
   c. Completing the electrical circuit within the alkaline solution by applying the external negative voltage polarity to a metallic member, now made cathodic;
   d. Removal of thermoelements from the alkaline solution and removal of their remaining surface layer residue chemically.

19. A method of manufacturing, as in claim 18, wherein the alkaline solution is a solution containing chromic acid.

20. A method of manufacture, as in claim 7, wherein steps (f) and (g) comprise:
   a. Immersion of the thermoelements into an acidic solution;
   b. Making the thermoelements cathodic through the application of an external negative polarity voltage to the thermoelements;
   c. Completing the electrical circuit within the acidic solution by applying the external positive voltage polarity to a metallic member, now made anodic;
   d. Plating a metallic layer on each surface of the thermoelements.

21. A method of manufacturing, as in claim 20, wherein the acidic solution is a solution containing sulfuric acid.

22. A method of manufacturing, as in claim 20, where the thermoelement surfaces are subjected to a current density greater than 150 amps per square foot of negatively charged surface area in the solution.

23. A method of manufacturing, as in claim 20, wherein the electrical potential applied to the thermoelements in steps (a) through (d) is applied prior to immersion of the thermoelements into each solution.

24. A method of manufacture, as in claim 7, wherein step (g) comprises:
   a. Depositing a bismuth layer on each junction face of the P and N-type thermoelements;
   b. Melting and solidifying the bismuth layer;
   c. Depositing a metallic layer on the bismuth layer.

25. A method of manufacturing, as in claim 24, wherein step (a) utilizes plating to deposit the bismuth layer.

26. A method of manufacture, as in claim 7, wherein the completed device in step (j) is subject to:
   a. Immersion of the thermoelements into a corrosive solution;
   b. Making the thermoelements anodic through the application of an external positive polarity voltage to the thermoelements;
   c. Completing the electrical circuit within the corrosive solution by applying the external negative voltage polarity to a metallic member, now made cathodic;
   d. Removal of thermoelements from the corrosive solution and removal of their remaining surface layer residue chemically.

27. A method of manufacturing, as in claim 26, wherein the solution contains chromic acid.

28. A method of manufacturing, as in claim 26, wherein step (b) polarity is negative and the step (c) polarity is positive.

29. A method of manufacture, as in claim 7, wherein the thermoelement materials, in powder form, are coated with boric acid prior to thermal processing (sintering, hot pressing, etc.) to getter surface oxides.

30. A method of manufacturing a thermoelectric device, including at least one thermoelement, an envelope or covering, one wafer containing at least two through holes, each containing dissimilar thermoelectric material wherein a pressurized liquid or gas is utilized to compact the thermoelements by applying pressure against the envelope which is in direct contact with each thermoelement.

31. A method of manufacturing a thermoelectric device, including at least one perforated metallic substrate with two or more through holes each filled with dissimilar thermoelement material in which the completed device is bonded to a perforated metallic substrate.

32. A method of manufacture, as in claim 31, which utilizes a conversion coated, anodized substrate.

33. A method of manufacture, as in claim 31, in which the bonding is accomplished through the use of an adhesive.

34. A method of manufacturing a thermoelectric device, including at least one thermoelement, one wafer containing at least two through-holes, each containing thermoelement material and at least one sheet of deformable material wherein the wafer and sheet of deformable material are stacked, such that the deformable material interfaces the exposed thermoelement faces, and subjected to heat and pressure, thereby causing the deformable material to deform and compress the thermoelement material into the wafer through-holes.

35. A method of manufacturing a thermoelectric device, as in claim 34, wherein the sheet of deformable material is comprised of aluminum.

36. A method of manufacturing a thermoelectric device, including at least one thermoelement, one wafer containing at least two through-holes, each containing P and N-type thermoelement material wherein both the P and N-type thermoelement materials are hot isostatic pressed simultaneously.

37. A method of manufacturing a thermoelectric device, as in claim 36, wherein both the P and N-type • thermoelement materials are hot pressed simultaneously.

* * * * *